United States Patent
Chaudhry et al.

(10) Patent No.: US 6,249,016 B1
(45) Date of Patent: Jun. 19, 2001

(54) INTEGRATED CIRCUIT CAPACITOR INCLUDING TAPERED PLUG

(75) Inventors: Samir Chaudhry; Sundar Srinivasan Chetlur; Nace Layadi; Pradip Kumar Roy; Hem M. Vaidya, all of Orlando, FL (US)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/364,603

(22) Filed: Jul. 30, 1999

Related U.S. Application Data

(60) Provisional application No. 60/118,785, filed on Jan. 13, 1999.

(51) Int. Cl.[7] ................................................ H01L 27/108
(52) U.S. Cl. .................... 257/296; 257/296; 257/298; 257/300; 257/301; 257/303; 257/306
(58) Field of Search ..................................... 257/296, 298, 257/300, 301, 303, 306

(56) References Cited

U.S. PATENT DOCUMENTS

| | | | |
|---|---|---|---|
| 5,668,041 | * 9/1997 | Okudaira et al. | 438/240 |
| 5,691,219 | * 11/1997 | Kawakubo et al. | 437/52 |
| 5,698,878 | * 12/1997 | Miyashita et al. | 257/301 |
| 5,728,596 | * 3/1998 | Prall | 437/52 |
| 5,801,079 | * 9/1998 | Takaishi | 438/396 |
| 5,903,493 | 5/1999 | Lee | 365/149 |
| 5,990,507 | 11/1999 | Mochizuki et al. | 257/295 |
| 6,051,859 | 4/2000 | Hosotani et al. | 257/306 |

FOREIGN PATENT DOCUMENTS

| | | | |
|---|---|---|---|
| 405251658 | * 9/1993 | (JP) | 257/306 |
| 405308131 | * 9/1993 | (JP) | 257/396 |

* cited by examiner

*Primary Examiner*—Eddie C. Lee
*Assistant Examiner*—Edgardo Ortiz
(74) *Attorney, Agent, or Firm*—Allen, Dyer, Doppelt, Milbrath & Gilchrist, P.A.

(57) ABSTRACT

An integrated circuit capacitor includes a first dielectric layer adjacent a substrate and having a trench therein, and a metal plug comprising an upper portion extending upwardly into the trench, and a lower portion disposed in the first dielectric layer. The lower portion has a tapered width which increases in a direction toward the substrate to thereby secure the metal plug in the dielectric layer. Preferably, the upper portion is also tapered. Furthermore, a second dielectric layer is adjacent the metal plug with an upper electrode thereon.

33 Claims, 3 Drawing Sheets

INTEGRATED CIRCUIT CAPACITOR INCLUDING TAPERED PLUG

RELATED APPLICATION

This application is based upon prior filed copending provisional application Serial No. 60/115,785 filed Jan. 13, 1999.

FIELD OF THE INVENTION

The present invention relates to the field of semiconductor devices, and, more particularly, to a capacitor.

BACKGROUND OF THE INVENTION

Capacitors are used extensively in electronic devices for storing an electric charge. A capacitor includes two conductive plates or electrodes separated by an insulator. The capacitance, or amount of charge held by the capacitor per applied voltage, depends upon the area of the plates, the distance between them, and the dielectric value of the insulator. Capacitors may be formed within a semiconductor device, such as, for example, a dynamic random access memory (DRAM) or an embedded DRAM.

As semiconductor memory devices become more highly integrated, the area occupied by the capacitor of a DRAM storage cell is reduced, thus decreasing the capacitance of the capacitor due to a smaller electrode surface area. However, a relatively large capacitance is desired to prevent loss of stored information. Therefore, it is desirable to reduce the cell dimensions and yet obtain a high capacitance, which achieves both high cell integration and reliable operation.

One technique for increasing the capacitance while maintaining the high integration of the storage cells is directed toward the shape of the capacitor electrodes. In this technique, the polysilicon layer of the capacitor electrodes may have protrusions, fins, cavities, etc., to increase the surface area of the capacitor electrode, thereby increasing its capacitance while maintaining the small area occupied on the substrate surface.

Instead of forming the capacitor on the substrate surface, capacitors are also formed above the substrate, i.e., they are stacked above the substrate. The surface area of the substrate can then be used for forming transistors. U.S. Pat. No. 5,903,493 to Lee discloses a capacitor formed above a tungsten plug. The surface area of the capacitor is increased by etching a trench in the dielectric layer around the tungsten plug. The tungsten plug interfaces with an interconnection line, thus allowing different layers formed above the substrate to be connected.

The trench is patterned by conventional etching or other suitable techniques. The fundamental limit on how far the trench can be etched is determined by how well the tungsten plug is secured within the dielectric layer. Typically, the depth of the trench is limited to about one half the thickness of the dielectric layer. After the trench has been etched, a capacitor is formed above the tungsten plug. Unfortunately, if the trench is etched beyond one half the thickness of the dielectric, the tungsten plug is more likely to become loose and fall out. This physical separation between the tungsten plug and the underlying metal interconnection with interconnect line can cause open circuits to be formed resulting in complete failure of the device or circuit.

A known approach to secure the metal plug uses a metal plug with an anchor portion extending into the interconnect line. This approach uses an additional wet etch, reactive ion etch (RIE) or plasma etch to form an anchor hole in the interconnect line and below the dielectric layer.

SUMMARY OF THE INVENTION

In view of the foregoing background, it is therefore an object of the present invention to increase the capacitance of an integrated circuit capacitor without decreasing the reliability of the capacitor.

This and other advantages, features and objects in accordance with the present invention are provided by an integrated circuit capacitor including a first dielectric layer adjacent a substrate and having a trench therein, and a metal plug comprising an upper portion extending upwardly into the trench, and a lower portion disposed in the first dielectric layer and having a tapered width which increases in a direction toward the substrate. The tapered width of the metal plug secures or anchors the metal plug in the dielectric layer. The angle of taper may preferably be greater than about 2° and more preferably greater than about 5°. The metal plug may be formed of tungsten. Furthermore, a second dielectric layer is adjacent the metal plug with an upper electrode thereon. Preferably, a lower electrode is between the metal plug and the second dielectric layer.

The upper portion may also have a tapered width which increases in the direction toward the substrate. Also, the trench depth is preferably greater than about half a thickness of the first dielectric layer, e.g. greater than about 250 angstroms. The capacitor preferably includes an interconnection line extending below the first dielectric layer and connected to the metal plug. Additionally, the upper portion of the metal plug preferably has an upper most surface substantially co-planar with an adjacent uppermost surface of the first dielectric layer, and the upper portion preferably extends upwardly in a medial portion of the trench.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

Figure 1:
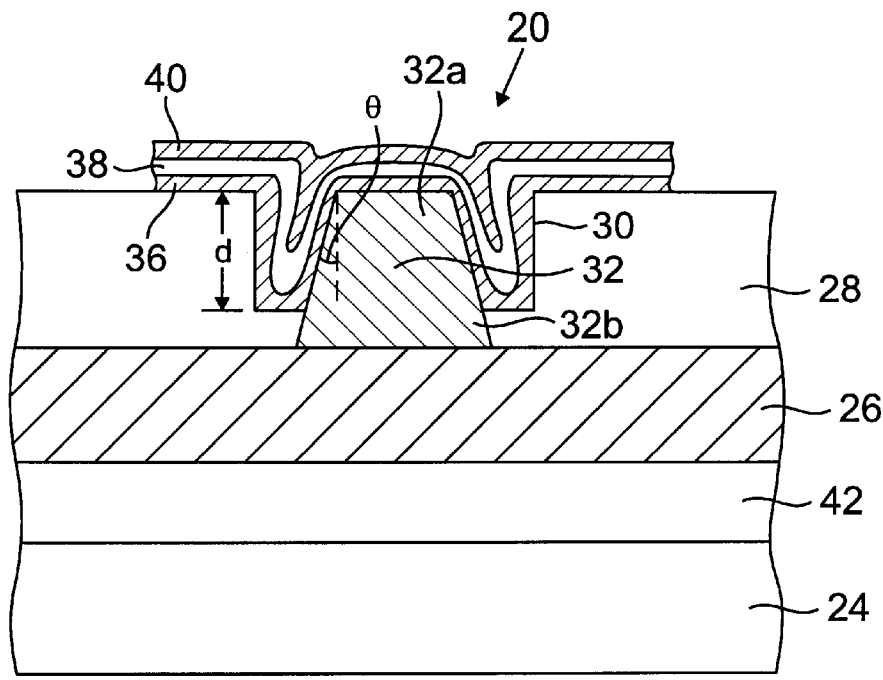
FIG. 1 is a cross-sectional view of an integrated circuit capacitor in accordance with the E present invention.
Figure 2:
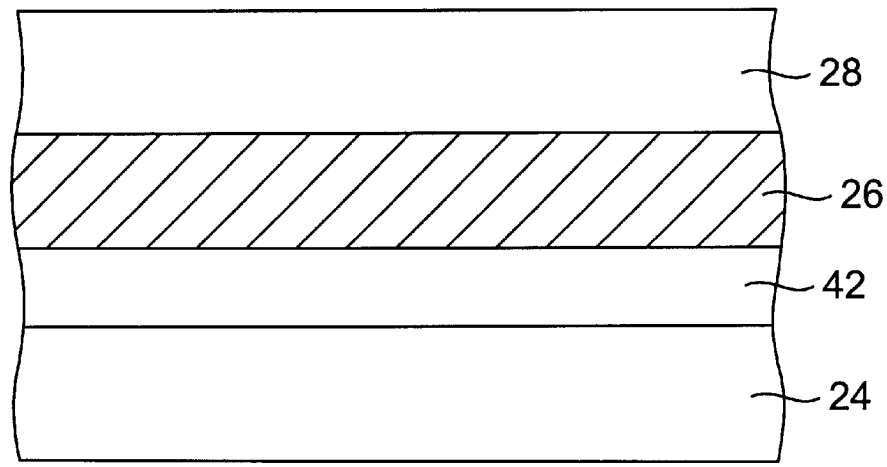
FIGS. 2–5 are cross-sectional views illustrating the process steps for forming a capacitor in accordance with the present invention.

Referring initially to FIG. 1, a cross-sectional view of an integrated circuit capacitor 20 including a tapered metal plug 32 is now described. The integrated circuit capacitor 20 is formed on a substrate 24 with an interconnect line 26 adjacent the substrate, and a first dielectric layer 28 is on the interconnection line. The first dielectric layer 28 includes a trench 30 formed therein. The trench 30 is formed around the tapered plug 32 allowing the capacitor 20 to occupy a greater surface area, thus increasing its capacitance.

The tapered plug 32 includes an upper portion 32a extending upwardly into the trench 30, and a lower portion 32b disposed in the first dielectric layer 28. The tapered plug 32 has a tapered width which increases in a direction toward the substrate 24. Thus, the lower portion 32b of the tapered plug 32 engages lowermost portions of the first dielectric layer 28 to secure or anchor the tapered plug 32. The angle of taper θ, as measured from an imaginary line perpendicular to an upper plane of the metal plug 32, may preferably be greater than about 2° and more preferably greater than about 5°.

Because the tapered plug 32 is secured, a depth d of the trench can be greater than half the thickness of the first dielectric layer 28 without the tapered plug becoming loose and possibly separating from the underlying interconnect line 26. If this were to occur, an open circuit could result and lead to failure of the device or the circuit incorporating the integrated circuit capacitor 20. The capacitor 20 includes lower and upper electrodes 36, 40 and a second dielectric layer 38 therebetween. The lower electrode 36 lines the trench 30 and contacts the tapered plug 32. The second dielectric layer 38 overlies the lower electrode 36, and the upper electrode 40 overlies the second dielectric layer. Alternatively, for example, the capacitor may include the tapered plug 32 as the lower electrode, the second dielectric layer 38 lining the trench 30 and the upper electrode 40 overlying the second dielectric layer.

As semiconductor devices, e.g., an embedded dynamic random access memory (EDRAM), become more highly integrated, the capacitance of a capacitor decreases because of its smaller electrode surface area. However, a relatively large capacitance is desired to prevent loss of stored data. Therefore, increasing the depth d of the trench in accordance with the present invention increases the surface area of the lower and upper electrodes 36, 40. This advantageously increases the capacitance of the capacitor 20.

The interconnect line 26 may include a multilayer interconnect formed on an insulating layer 42. The insulating layer 42 is formed on or above the semiconductor substrate 24. The semiconductor substrate 24 contains a plurality of active devices, such as transistors, which are connected together into functional circuits by the interconnect line 26.

The multilayer interconnect may include a conductive capping layer, a bulk conductor, and an electromigration barrier layer (not shown) as would readily be appreciated by those skilled in the art. Additionally, an anti-reflective coating (ARC), such as titanium nitride, may be formed on the interconnect line 26.

The integrated capacitor 20 is electrically connected to the interconnect line 26 by the tapered plug 32. The tapered plug 32 preferably includes tungsten or any suitable, electrically conductive material such as aluminum, titanium or titanium nitride. An important feature of the present invention is that the tapered plug 32 is secured to the interconnect line 26 to prevent the plug from becoming loose and possibly separating from the underlying interconnection line.

As previously discussed, the capacitance of the capacitor 20 is increased by forming a trench 30 in the first dielectric layer 28. The tapered plug 32 extends upwardly in a medial portion of the trench 30. The trench 30 is patterned, e.g., by conventional etching or other suitable techniques. For example, an etch stop (not shown), such as silicon nitride, can be formed within the first dielectric layer 28 during its formation. Accordingly, the etch stop determines the actual depth d of the trench 30.

Without the tapered width of the tapered plug 32 securing the tapered plug to the interconnect line 26, the depth d of the trench 30 would typically be limited to about half the thickness of the first dielectric layer 28, which is generally in a range of about 4,000 to 6,000 angstroms. Accordingly, with the tapered plug 32, the depth d of the trench 30 is in a range of about 2,000 to 4,500 angstroms depending on the actual thickness of the first dielectric layer 28.

Once the trench 30 has been formed, the capacitor 20 is then formed. The lower electrode 36 lines the trench 30 and contacts the tapered plug 32. The lower electrode 36 may be made from any material suitable for conducting and holding an electric charge. Suitable materials include titanium nitride, aluminum, copper, silver, titanium or noble metals such as gold, platinum and/or palladium. The thickness of the lower electrode 36 is in a range of about 75 to 750 angstroms. It is also possible for the lower electrode 36 to be multi-layered, e.g., having a layer of titanium coated with a layer of titanium nitride.

The second dielectric layer 38 overlies the lower electrode 36 and is formed from any suitable dielectric, e.g., silicon dioxide, silicon nitride and/or any material or alloy of material having a suitably large dielectric constant. Other suitable materials include tantalum pentoxide and barium strontium titantate, for example. The thickness of the second dielectric 38 may be in a range of about 25 to 250 angstroms.

The upper electrode 40 overlies the second dielectric layer 38. Like the lower electrode 36, the upper electrode 40 is capable of being made from any material suitable for conducting and holding an electric charge. The thickness of the upper electrode 40 may be in a range of about 150 to 2,500 angstroms. It is also possible for the upper electrode 40 to be multi-layered or even doped, e.g. aluminum alloyed with a second material, such as copper or silicon.

A method for making the integrated circuit capacitor 20 including a tapered plug 32 as described above will now be further discussed with reference to FIGS. 2–5. The semiconductor substrate 24 is preferably silicon, or may be silicon or a polysilicon layer or structure formed on the substrate. A plurality of devices, such as transistors (not shown), are formed in the substrate 24 using well known techniques. Next, the dielectric layer 42, such as a doped or undoped silicon dioxide, is formed over the substrate 24 with well known techniques, such as thermal growth or deposition.

Next, the interconnection line 26 is formed on the dielectric layer 42. As an example, an approximately 4,500 angstrom thick aluminum alloy layer comprising approximately 1% copper may be formed on a titanium layer using well known techniques, such as sputtering. An aluminum alloy layer has low resistivity and is readily procured; however, other low resistance materials may be used as a bulk conductor in the interconnect line 26, as will be appreciated by those skilled in the art. As discussed above, the interconnect line 26 may be a multilayer interconnect as would readily be appreciated by those skilled in the art. Additionally, an anti-reflective coating (ARC), such as titanium nitride, may be formed on the interconnect line 26.

The first dielectric layer 28, such as a doped silicon dioxide, is formed over the interconnect line 26. Any well known technique can be used to form the first dielectric layer 28, such as chemical vapor deposition (CVD). The first dielectric layer 28 is preferably planarized at this time by chemical-mechanical polishing or etch back to form a planar top surface. The resulting thickness of the first dielectric layer 28 should be thick enough after planarization to provide adequate electrical isolation of the interconnect line 26 from a subsequent level of metallization. For example, an approximate thickness of 4,000 to 6,000 angstroms provides suitable isolation.

Figure 3:
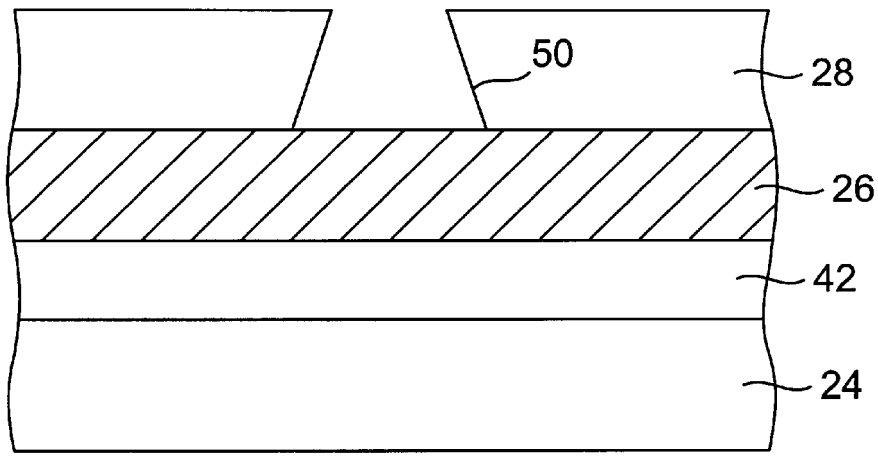

A photoresist layer (not shown) is formed and patterned over the first dielectric layer 28 using well known photolithography techniques to define the location where a tapered via hole 50 is to be formed. Next, the exposed portions of the first dielectric layer 28 are etched. The tapered via hole 50 is etched until the interconnect line 26 is exposed, as shown in FIG. 3. In one embodiment, a directional reactive ion etch (RIE) is used to form the via hole 50. A free tilt wafer holder may be used to achieve the desired taper using the RIE process. The tapered via hole 50 could then be etched using standard etch conditions. Typical etchants are $C_4F_8$/CO/Ar/$O_2$ mixtures. The wafer could be directionally etched at one angle, then rotated 180°, returned to the etch chamber, tilted and etched again. This would produce the desired tapered shape to the via hole 50.

Figure 4:
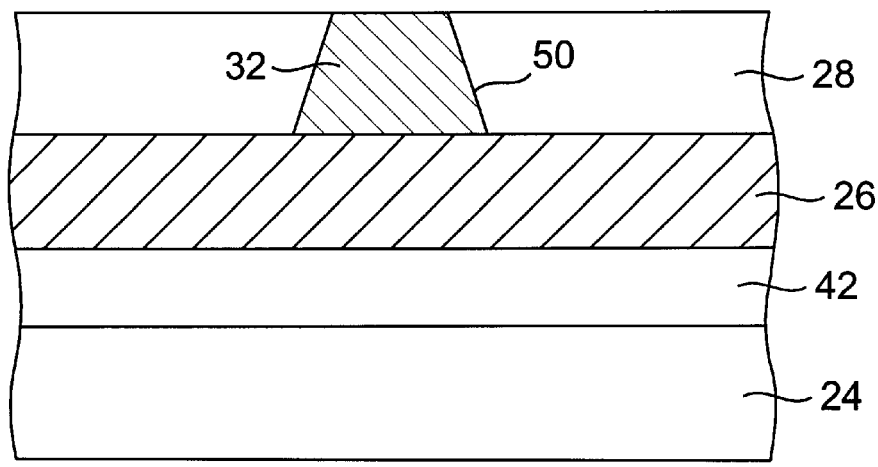

Referring now to FIG. 4, the via hole 60 is filled with a conductive material, preferably tungsten, using well known techniques for forming the tapered metal plug 32. Prior to forming the tapered plug 32, a nucleation layer, such as titanium nitride or tantalum nitride, may be sputter deposited on the side walls of the via hole 50, as would be appreciated by those skilled in the art. Also, a thin adhesion/barrier layer, such as titanium or titanium nitride can be blanket deposited into the via hole 50 using well known techniques such as sputtering. The conductive material is deposited into the via hole 50 until the via hole 50 is filled. A chemical-mechanical polishing technique may then be used to etch back the adhesion/barrier metals and any conductive material deposited on the first dielectric layer 28. Other well known etch back techniques can be used, such as reactive ion etching (RIE).

Figure 5:
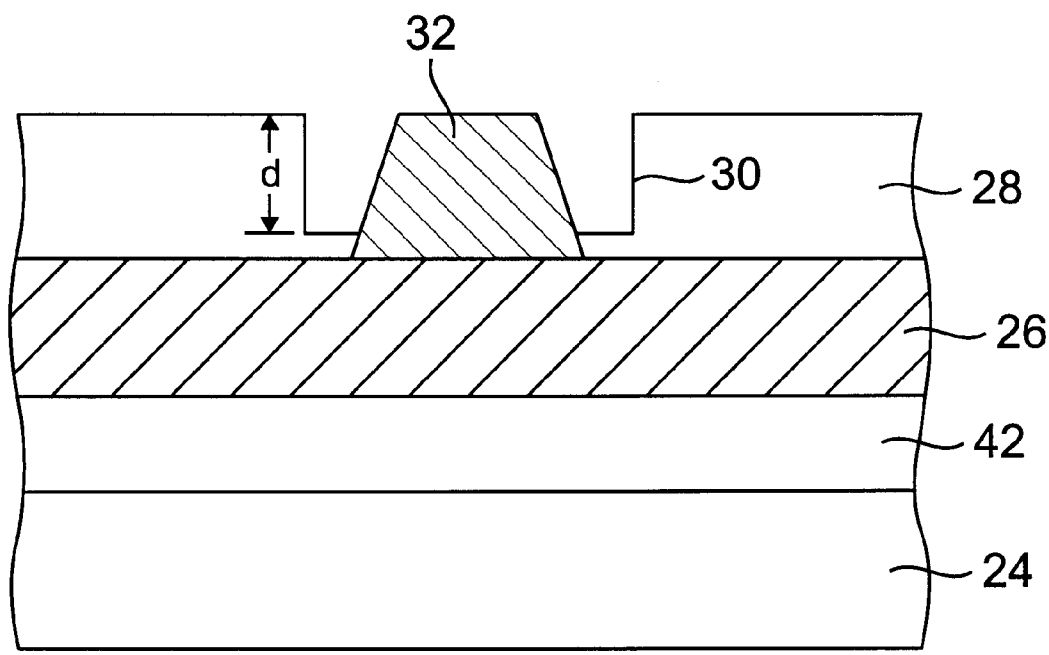

A trench 30 is now formed around the metal plug 32, as best shown in FIG. 5. The trench 30 is formed by patterning a trench around the metal plug 32 by conventional etching or other suitable techniques. For example, a silicon nitride etch stop may be formed within the first dielectric layer 28 during its formation. Accordingly, the etch stop would determine the actual depth d of the trench 30. Because the metal plug 32 is secured to the interconnect line 26, positioning of the etch stop can be greater than half the thickness of the first dielectric layer 28. This advantageously allows the capacitance of the capacitor 20 to be increased because of the increased surface area available for forming the capacitor.

Once the trench 30 has been formed, the lower electrode 36 of the capacitor 20 is formed by depositing an electrically conductive material on the first dielectric layer 28, including the trench 30 and the metal plug 32, as illustrated in FIG. 1. The lower electrode 36 is then selectively formed by an appropriate technique, such as chemical vapor deposition (CVD). Other methods of depositing the lower electrode 36 may include sputtering, reactive sputter etching (RSE), and plasma enhanced chemical vapor deposition (PECVD). The second dielectric layer 38 is selectively formed over the lower electrode 36 using an appropriate technique. The second dielectric layer 38 may be deposited using CVD or any of the other techniques referenced with respect to depositing the lower electrode 36. The upper electrode 40 is then deposited by CVD, for example, and selectively patterned by an appropriate patterning technique. Other methods of depositing the upper electrode 40 include physical vapor deposition (PVD), sputtering, reactive sputter etching (RSE), and plasma enhanced chemical vapor deposition (PECVD). The capacitor 20 thus includes the lower and upper electrodes 36, 40 and the second dielectric layer 38 therebetween, as shown in FIG. 1.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit capacitor comprising:
    a substrate;
    a first dielectric layer adjacent said substrate and having a trench therein;
    a metal plug comprising
        an upper portion extending upwardly into said trench, and
        a lower portion disposed in said first dielectric layer and having a tapered width which increases in a direction toward said substrate to secure said metal plug in said first dielectric layer;
    a second dielectric layer adjacent said metal plug; and
    an upper electrode layer on said second dielectric layer.

2. An integrated circuit capacitor according to claim 1, further comprising a lower electrode layer between said metal plug and said second dielectric layer.

3. An integrated circuit capacitor according to claim 1, wherein said upper portion also has a tapered width which increases in the direction toward said substrate.

4. An integrated circuit capacitor according to claim 1, wherein the tapered width of said lower portion of said metal plug has an angle of taper greater than about 2°.

5. An integrated circuit capacitor according to claim 1, wherein the tapered width of said lower portion of said metal plug has an angle of taper greater than about 5°.

6. An integrated circuit capacitor according to claim 1, wherein the trench has a depth greater than about half a thickness of said first dielectric layer.

7. An integrated circuit capacitor according to claim 1, wherein a depth of the trench is greater than about 250 angstroms.

8. An integrated circuit capacitor according to claim 1, further comprising an interconnection line extending below said first dielectric layer and connected to said metal plug.

9. An integrated circuit capacitor according to claim 1, wherein said upper portion of said metal plug has an upper most surface substantially co-planar with an adjacent uppermost surface of said first dielectric layer.

10. An integrated circuit capacitor according to claim 1, wherein said metal plug comprises tungsten.

11. An integrated circuit capacitor according to claim 1, wherein said upper portion of said metal plug extends upwardly in a medial portion of the trench.

12. An integrated circuit capacitor comprising:
    a substrate;
    an interconnection line adjacent said substrate;
    a first dielectric layer on said interconnection line and having a trench therein;
    a metal plug comprising
        an upper portion extending upwardly into said trench, and
        a lower portion disposed in said first dielectric layer and contacting said interconnection line, said lower portion having a tapered width which increases in a direction toward said substrate;
    a second dielectric layer adjacent said metal plug; and
    an upper electrode layer on said second dielectric layer.

13. An integrated circuit capacitor according to claim 12, further comprising a lower electrode layer between said metal plug and said second dielectric layer.

14. An integrated circuit capacitor according to claim 12, wherein said upper portion also has a tapered width which increases in the direction toward said substrate.

15. An integrated circuit capacitor according to claim 12, wherein the tapered width of said lower portion of said metal plug has an angle of taper greater than about 2°.

16. An integrated circuit capacitor according to claim 12, wherein the tapered width of said lower portion of said metal plug has an angle of taper greater than about 5°.

17. An integrated circuit capacitor according to claim 12, wherein the trench has a depth greater than about half a thickness of said first dielectric layer.

18. An integrated circuit capacitor according to claim 12, wherein a depth of the trench is greater than about 250 angstroms.

19. An integrated circuit capacitor according to claim 12, further comprising an interconnection line extending below said first dielectric layer and connected to said metal plug.

20. An integrated circuit capacitor according to claim 12, wherein said upper portion of said metal plug has an upper most surface substantially co-planar with an adjacent upper-most surface of said first dielectric layer.

21. An integrated circuit capacitor according to claim 12, wherein said metal plug comprises tungsten.

22. An integrated circuit capacitor according to claim 12, wherein said upper portion of said metal plug extends upwardly in a medial portion of the trench.

23. An integrated circuit capacitor comprising:

a substrate;

a first dielectric layer adjacent said substrate and having a trench therein, the trench having a depth greater than about half a thickness of said first dielectric layer;

a metal plug having a tapered width which increases in the direction of said substrate, said metal plug comprising an upper portion extending upwardly into said trench, and a lower portion disposed in said first dielectric layer;

a second dielectric layer adjacent said metal plug; and an upper electrode layer on said second dielectric layer.

24. An integrated circuit capacitor according to claim 23, further comprising a lower electrode layer between said metal plug and said second dielectric layer.

25. An integrated circuit capacitor according to claim 23, wherein said upper portion and said lower portion have a tapered width which increases in the direction toward said substrate.

26. An integrated circuit capacitor according to claim 23 wherein the tapered width of said metal plug has an angle of taper greater than about 2°.

27. An integrated circuit capacitor according to claim 23, wherein the tapered width of said metal plug has an angle of taper greater than about 5°.

28. An integrated circuit capacitor according to claim 23, wherein the trench has a depth greater than about half a thickness of said first dielectric layer.

29. An integrated circuit capacitor according to claim 23, wherein a depth of the trench is greater than about 250 angstroms.

30. An integrated circuit capacitor according to claim 23, further comprising an interconnection line extending below said first dielectric layer and connected to said metal plug.

31. An integrated circuit capacitor according to claim 23, wherein said upper portion of said metal plug has an upper most surface substantially co-planar with an adjacent upper-most surface of said first dielectric layer.

32. An integrated circuit capacitor according to claim 23, wherein said metal plug comprises tungsten.

33. An integrated circuit capacitor according to claim 23, wherein said upper portion of said metal plug extends upwardly in a medial portion of the trench.

* * * * *